(12) United States Patent
Anderson et al.

(10) Patent No.: US 8,137,791 B2
(45) Date of Patent: Mar. 20, 2012

(54) FUSE AND PAD STRESS RELIEF

(75) Inventors: Felix Patrick Anderson, Colchester, VT (US); Jeffrey Peter Gambino, Westford, VT (US); Thomas Leddy McDevitt, Underhill, VT (US); Anthony Kendall Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 1042 days.

(21) Appl. No.: 11/954,557

(22) Filed: Dec. 12, 2007

(65) Prior Publication Data

US 2009/0155541 A1   Jun. 18, 2009

(51) Int. Cl.
 *H01L 21/4763* (2006.01)
 *H01L 21/44* (2006.01)
 *H01L 29/40* (2006.01)
 *H01L 23/52* (2006.01)
 *H01L 23/48* (2006.01)
 *B32B 15/04* (2006.01)
 *B32B 9/06* (2006.01)

(52) U.S. Cl. ........ 428/173; 428/446; 428/450; 257/762; 257/773; 438/633; 438/637; 438/675; 438/687

(58) Field of Classification Search ............... 428/173, 428/446, 450; 257/642, 649, 752, 759, 762, 257/773, 774, 21, 576, 647, E21.011, E21.175, 257/508, 575, 577, 579, 585, 586, 152, 169, 257/E23.145; 438/631, 633, 634, 650, 678, 438/612, 614–619, 637–639, 672–687, 640, 438/430, 688, 666, 668
See application file for complete search history.

(56) References Cited

U.S. PATENT DOCUMENTS

| | | | |
|---|---|---|---|
| 5,776,826 A | 7/1998 | Mitwalsky et al. | |
| 6,295,721 B1 | 10/2001 | Tsai | |
| 6,340,638 B1 * | 1/2002 | Chen et al. | 438/687 |
| 2005/0026397 A1 | 2/2005 | Daubenspeck et al. | |
| 2006/0099775 A1 | 5/2006 | Daubenspeck et al. | |
| 2006/0223242 A1 | 10/2006 | Daubenspeck et al. | |
| 2008/0102599 A1 * | 5/2008 | Yang | 438/430 |

* cited by examiner

*Primary Examiner* — Catherine A Simone
(74) *Attorney, Agent, or Firm* — Schmeiser, Olsen & Watts; Richard Kotulak

(57) ABSTRACT

A structure and method of forming the structure. At least one copper wire is formed within a first dielectric layer of a substrate. The top surface of each copper wire and of the first dielectric layer are essentially coplanar. A recess is formed in the first dielectric layer from the top surface of each copper wire to a recess depth less than a thickness of each copper wire within the first dielectric layer such that the recess surrounds a perimeter surface of each copper wire. A capping layer, which is a copper diffusion barrier, is formed in the recess and on the top surface of each copper wire and on the first dielectric layer. A second dielectric layer is formed on the capping layer. The recess depth has a magnitude sufficient to prevent a lateral fail of the capping layer during packaging and/or operation of the substrate.

18 Claims, 13 Drawing Sheets

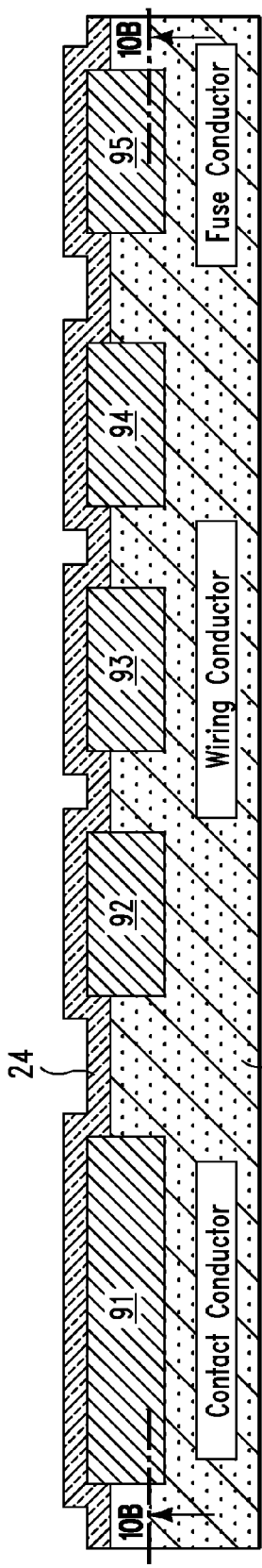
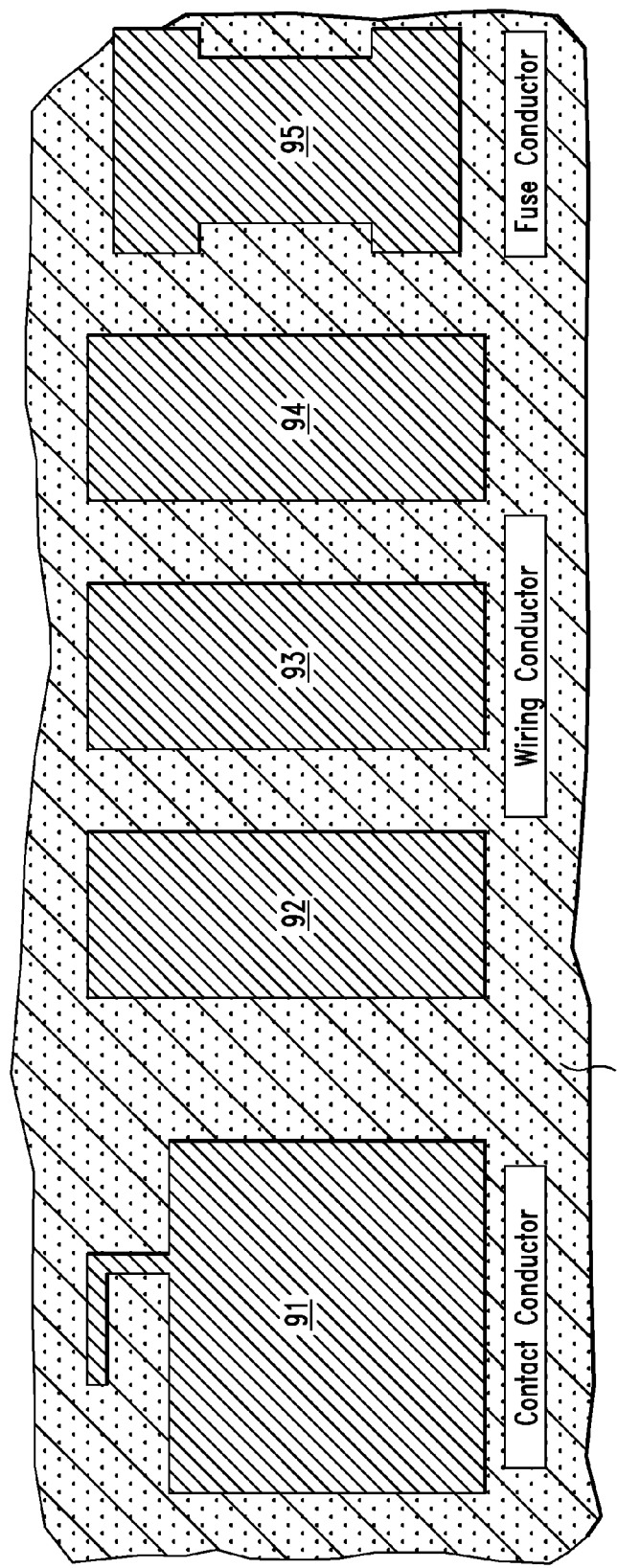
FIG. 10A
FIG. 10B

FUSE AND PAD STRESS RELIEF

FIELD OF THE INVENTION

The present invention provides a structure and a method for forming the structure so as to prevent delamination of a diffusion barrier layer from a dielectric layer.

BACKGROUND OF THE INVENTION

Crack propagation along a fuse or pad edge can occur due to weak adhesion of a nitride/oxide or nitride/oxide/nitride final passivation due to the presence of a planar surface. Thus, there is a need for improved adhesion of the final passivation to the underlying fuse or dielectric.

SUMMARY OF THE INVENTION

The present invention provides a method for forming a structure, comprising:

providing a substrate that comprises a first dielectric layer, wherein the first dielectric layer comprises a first dielectric material;

forming at least one copper wire within the first dielectric layer such that a top surface of each copper wire is essentially coplanar with a top surface of the first dielectric layer, wherein each copper wire comprises copper;

after said forming the at least one copper wire, forming a recess in the first dielectric layer from the top surface of each copper wire to a recess depth within the first dielectric layer such that the recess surrounds and is in direct mechanical contact with a perimeter surface of each copper wire, wherein the recess depth is less than a thickness of each copper wire in a direction perpendicular to the top surface of each copper wire;

after said forming the recess, forming a capping layer in the recess and on the top surface of each copper wire and on the top surface of the first dielectric layer;

forming a second dielectric layer comprising one or more dielectric sublayers on and in direct mechanical contact with the capping layer, wherein each dielectric sublayer comprises a dielectric material that is specific to each dielectric sublayer, wherein the capping layer comprises a capping material configured to prevent copper of each copper wire from passing through the capping layer into the second dielectric layer;

wherein the recess depth has a magnitude sufficient to prevent a lateral fail of the capping layer during packaging and/or operation of the substrate;

wherein the lateral fail comprises a delamination of a portion of the capping layer from the first dielectric layer;

wherein the delamination is characterized by an angular gap comprising an acute angle exceeding zero degrees between the capping layer and the top surface of the first dielectric layer.

The present invention provides a structure, comprising:

a substrate that comprises a first dielectric layer that includes a first dielectric material;

at least one copper wire, each copper wire within the first dielectric layer and extending above the first dielectric layer by a recess depth, wherein each copper wire comprises copper;

a recess having the recess depth from the top surface of each copper wire to at a top surface of the first dielectric layer such that the recess surrounds and is in direct mechanical contact with a perimeter surface of each copper wire, wherein the recess depth is less than a thickness of each copper wire in a direction perpendicular to the top surface of each copper wire;

a capping layer in the recess and on the top surface of each copper wire and on the top surface of the first dielectric layer;

a second dielectric layer comprising one or more dielectric sublayers on and in direct mechanical contact with the capping layer, wherein each dielectric sublayer comprises a dielectric material that is specific to each dielectric sublayer, wherein the capping layer comprises a capping material configured to prevent copper of each copper wire from passing through the capping layer into the second dielectric layer;

wherein the recess depth has a magnitude sufficient to prevent a lateral fail of the capping layer during packaging and/or operation of the substrate;

wherein the lateral fail comprises a delamination of a portion of the capping layer from the first dielectric layer;

wherein the delamination is characterized by an angular gap comprising an acute angle exceeding zero degrees between the capping layer and the top surface of the first dielectric layer.

The present invention advantageously prevents delamination of a diffusion barrier layer from a dielectric layer, and thus provides improved adhesion of the final passivation to the underlying fuse or dielectric.

BRIEF DESCRIPTION OF THE DRAWINGS

FIG. 10A depicts a cross-sectional view of copper wires in contact with the capping layer, in accordance with embodiments of the present invention.

FIG. 10B is a top cross-section view through line 10B-10B of FIG. 10A.

DETAILED DESCRIPTION OF THE INVENTION

Figure 1:
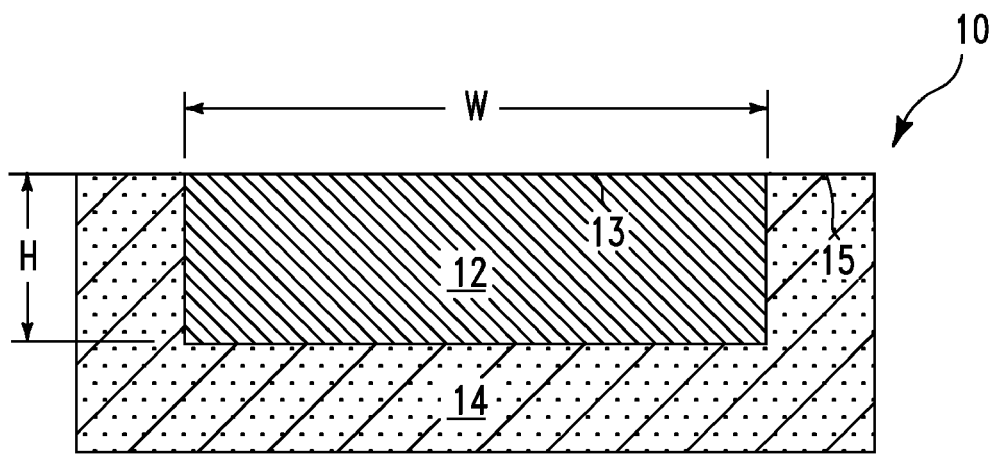
FIG. 1 depicts a cross-sectional view of a substrate comprising a copper wire within a first dielectric layer such that a top surface of the copper wire is essentially coplanar with a top surface of the first dielectric layer, in accordance with embodiments of the present invention.

FIG. 1 depicts a cross-sectional view of a substrate 10 comprising a copper wire 12 within a first dielectric layer 14 such that a top surface 13 of the copper wire 12 is essentially coplanar with a top surface 15 of the first dielectric layer 14, in accordance with embodiments of the present invention. The copper wire 12 comprises copper. In one embodiment, the copper wire 12 has a minimum width W and nominal height H determined by the ground rules for the technology. For 90 nm generation last Cu level wiring with twice the minimum pitch (wire width+wire space), the minimum W would be about 280 nm and nominal H would be about 500 nm; and the maximum wire width W would be 100's or 1000's of microns. In general, for integrated circuit technologies employing laser fuses, the wire width W has a minimum width in the range of 0.05 to 5 microns and height in the range of 0.2 to 4 microns. The first dielectric layer 14 comprises a dielectric material such as carbon doped oxide (CDO) fluorinated silicon dioxide (FSG), silicon dioxide (SiO2), etc. as known in the art. The copper wire 12 may be formed within the first dielectric layer 14 by, inter alia, a damascene process as is known in the art. The substrate 10 may be a portion of a semiconductor wafer that, after being fabricated, is configured to be electrically coupled to another substrate such as a chip carrier.

Figure 2A:
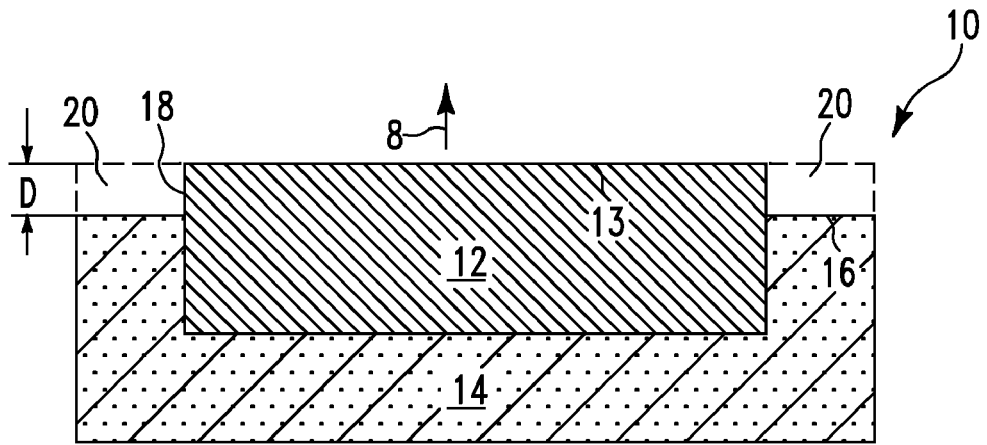
FIGS. 2A and 2B depict FIG. 1 after a top portion of the first dielectric layer has been removed to form a recess between a new top surface of the first dielectric layer and the top surface of the copper wire, in accordance with embodiments of the present invention.
Figure 2B:
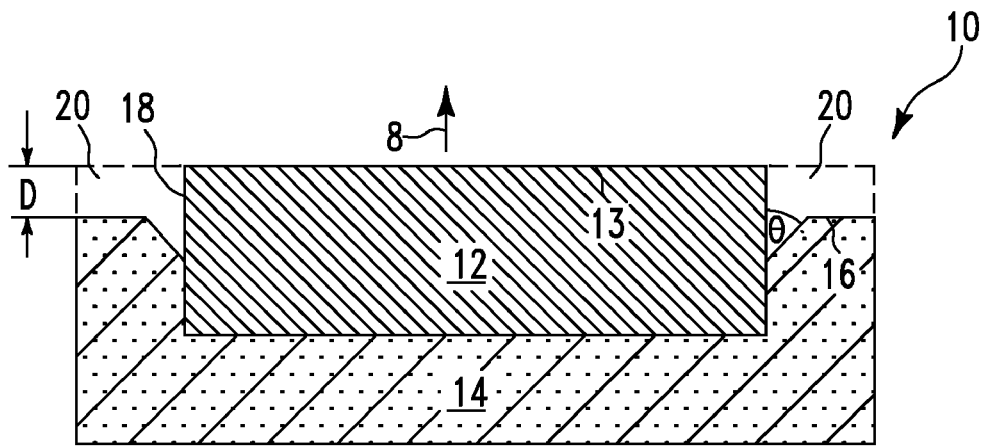

FIGS. 2A and 2B (collectively, "FIG. 2") depict FIG. 1 after a top portion of the first dielectric layer 14 at its top surface 15 has been removed to form a recess 20 of recess depth D between a new top surface 16 of the first dielectric layer 14 and the top surface 13 of the copper wire 12, in accordance with embodiments of the present invention. In FIG. 2A, the surface 16 contacts the perimeter surface 18 of the copper wire 12 perpendicularly. In FIG. 2B, the surface 16 contacts the perimeter surface 18 at an acute angle θ.

The recess 20 surrounds and is in direct mechanical contact with the perimeter surface 18 of the copper wire 12. The recess depth D may be less than a thickness of the first copper wire in a direction 8 perpendicular to the top surface 13 of the copper wire 12. The recess depth D has a value that is constant or variable around the perimeter surface 18 of the copper wire 12. In one embodiment, a constant or average value of the recess depth D is in a range of 50 to 200 nanometers (e.g., about 100 nanometers) and the wire height is 500 nm. The recess depth D that is in a range of 50 to 200 nanometers serves to prevent a lateral fail that may otherwise occur during operation (e.g., laser fuse blowing) and/or packaging of the substrate, as described infra in conjunction with FIGS. 13 and 14. If a wet etch process, such as 100:1 dilute hydrofluoric acid (DHF) is employed, then the recess will not be totally horizontal as shown in FIG. 2A but instead will exhibit preferential etching adjacent to the copper wire 12, as shown in FIG. 2B, resulting in the acute angle θ whose magnitude may vary from just above zero degrees to just below 90 degrees depending on the details of the aforementioned preferential etching.

In one embodiment, a variable recess depth D may be configured such that the recess depth D varies discontinuously around the perimeter surface 18 of the copper wire 12. For example, if the copper wire 12 has a rectangular shape, the recess depth D may be constant on each side of the rectangular shape of the copper wire 12, but may be different (i.e., greater or lesser) for different sides.

Figure 3:
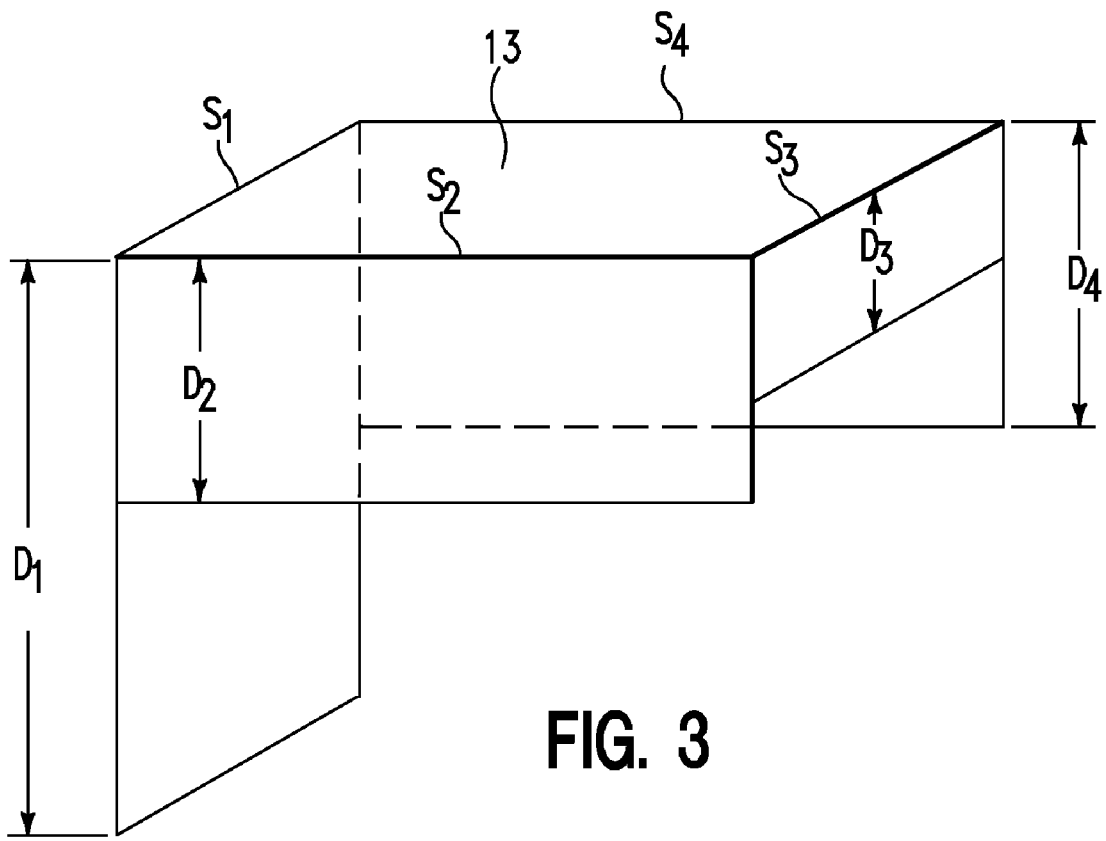
FIG. 3 is a top view of the top surface of copper wire in FIG. 2 in accordance with embodiments of the present invention.

FIG. 3 is a top view of the top surface 13 of copper wire 12 in FIG. 2 in accordance with embodiments of the present invention. In FIG. 3, the rectangular shape of the top surface 13 of the copper wire 12 has four sides S1, S2, S3, S4 with associated recess depths D1, D2, D3, D4, respectively, such that sides S1 and S3 are respectively parallel to sides S2 and S4. In one embodiment D1=D3, D2=D4, and D1>D2 wherein D2=0 or D2>0. In one embodiment, D1=D2, D3=D4, and D1>D3, wherein D3=0 or D3>0. In one embodiment, D1=D2=D3>D4, wherein D4=0 or D4>0. In one embodiment, D1=D2>D3>D4, wherein D4=0 or D4>0. In one embodiment, D1>D2>D3>D4, wherein D4=0 or D4>0. In one embodiment, D1, D2, D3, and D4 all different and have a positive value.

The removal of the top portion of the first dielectric layer 14 to form the recess 20 in FIG. 2 may be implemented by, inter alia, etching the first dielectric layer 14 with an etchant, using a mask to selectively etch the first dielectric layer 14 with respect to the copper wire 12. The etchant may be, inter alia, hydrofluoric acid that has been diluted with water in accordance with a dilution ratio such as 100:1 to 300:1 of water to hydrofluoric acid.

The embodiments in which the recess depth D is formed to be variable around the perimeter surface 18 of the copper wire 12 may be implemented by using a mask that not only masks the copper wire 12, but also is selectively disposed above the first dielectric layer 14 in a timewise manner such that the dielectric material of the first dielectric layer 14 is exposed to the etchant for different periods of time so as to cause variable recess depths D1, D2, D3, D4 in FIG. 3 to be formed around the perimeter surface 18 of the copper wire 12 in dependence on the different periods of time of exposure of the dielectric material of the first dielectric layer 14 to the etchant.

Figure 4:
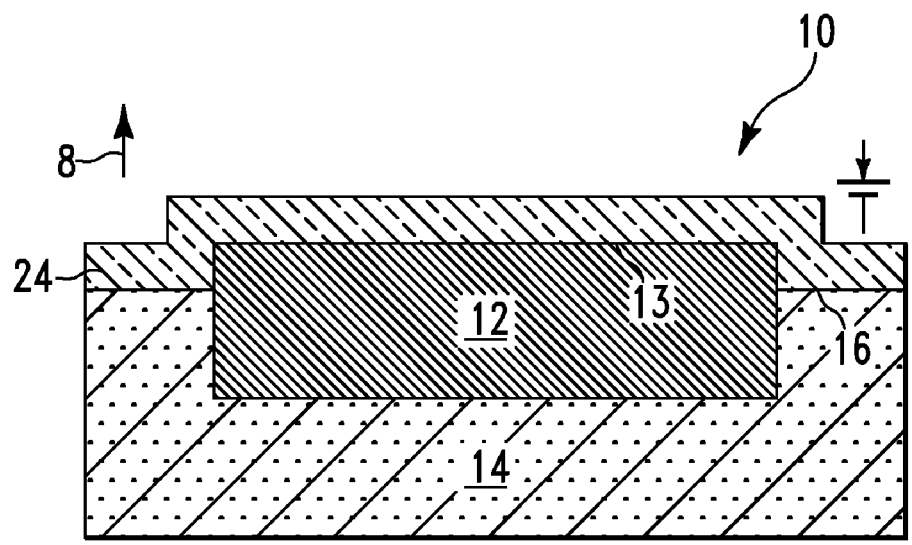
FIG. 4 depicts FIG. 2 after a dielectric capping layer is formed on and in direct mechanical contact with the copper wire and the first dielectric layer, in accordance with embodiments of the present invention.

FIG. 4 depicts FIG. 2 after a dielectric capping layer 24 is formed on and in direct mechanical contact with the surface 13 of copper wire 12 and the surface 16 of first dielectric layer 14, in accordance with embodiments of the present invention. The capping layer 24 comprises a capping material that functions as a copper diffusion barrier configured to prevent a diffusion of copper of the copper wire 12 from passing through a total thickness of the capping layer and into a second dielectric layer 26 (see FIG. 4, described infra) in a direction 8 that is normal to the surface 13 of the copper wire 12. In one embodiment, the capping layer 14 has a thickness T above the top surface 13 of the copper wire 12 in a range of 30-200 nm. In one embodiment, the capping material of the capping layer 24 may comprise, inter alia, a dielectric material such as silicon nitride (SiN), silicon carbide (SiC), and SiCN. The capping layer 24 may be formed by deposition of the capping material on the surface 13 of copper wire 12 and the surface 16 of first dielectric layer 14 by, inter alia, plasma enhanced chemical vapor deposition (CVD), high density plasma CVD, etc. using a reducing plasma, such as ammonia or hydrogen, or an exposure to silane to form copper silicide, as known in the art. Other embodiments pertaining to the capping layer 24 are described infra in conjunction with FIGS. 6A and 6B.

Figure 5A:
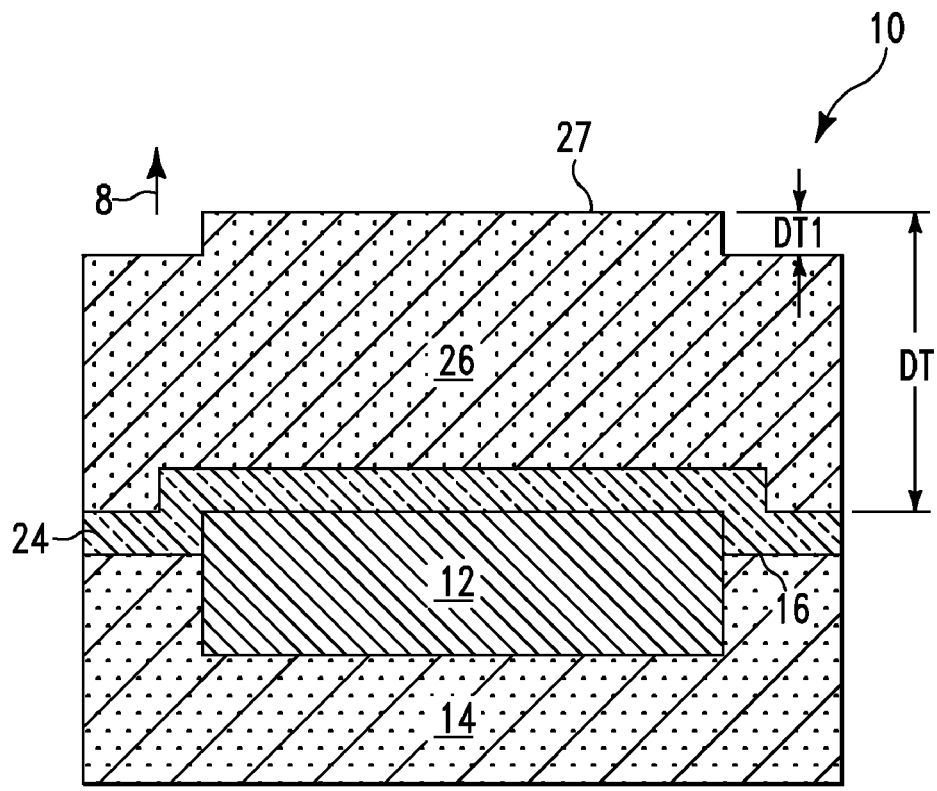
FIG. 5A depicts FIG. 4 after a second dielectric layer has been formed on the capping layer, in accordance with embodiments of the present invention.

FIG. 5A depicts FIG. 4 after a second dielectric layer 26 has been formed on the capping layer 24, in accordance with embodiments of the present invention. The second dielectric layer 26 has a top surface 27. The second dielectric layer 26 comprises one or more dielectric sublayers, each dielectric sublayer comprising a dielectric material that is specific to each dielectric sublayer. In one embodiment, the second dielectric layer 26 comprises a lower sublayer including silicon dioxide on the capping layer 24 and an upper sublayer including silicon nitride on the lower sublayer. In one embodiment, each sublayer has a thickness in the direction 8 of the order of about one micron. In one embodiment, the second dielectric layer 26 has a dielectric thickness DT in a range of 0.5 to 3 microns.

Figure 5B:
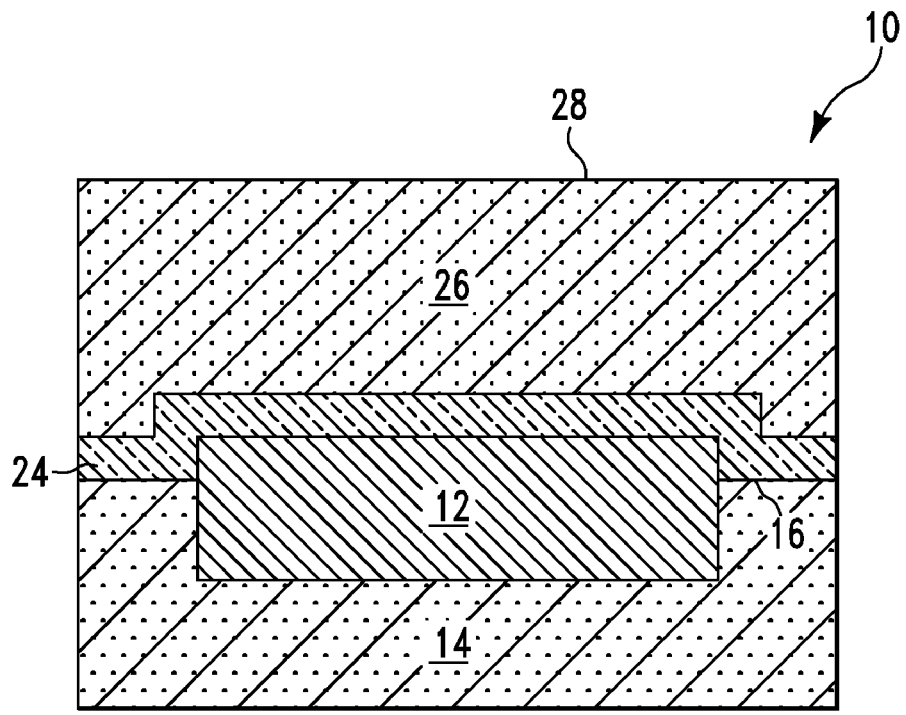
FIG. 5B depicts FIG. 5A after a thickness portion has been removed from the second dielectric layer, in accordance with embodiments of the present invention.

FIG. 5B depicts FIG. 5A after a thickness portion DT1 has been removed from the second dielectric layer 26 at the top surface 27, in accordance with embodiments of the present invention. As a result of the removal of the thickness portion DT1, the second dielectric layer 26 has a new top surface 28, which may have been cleaned and planarized such as by chemical mechanical polishing (CMP). In one embodiment, the thickness portion DT1 may be in a range of 100 to 300 nanometers (e.g., about 200 nanometers). This optional step depicted in FIG. 5B is only required if a planer surface is needed to optimize the yield or reliability of the subsequent steps.

Figure 6A:
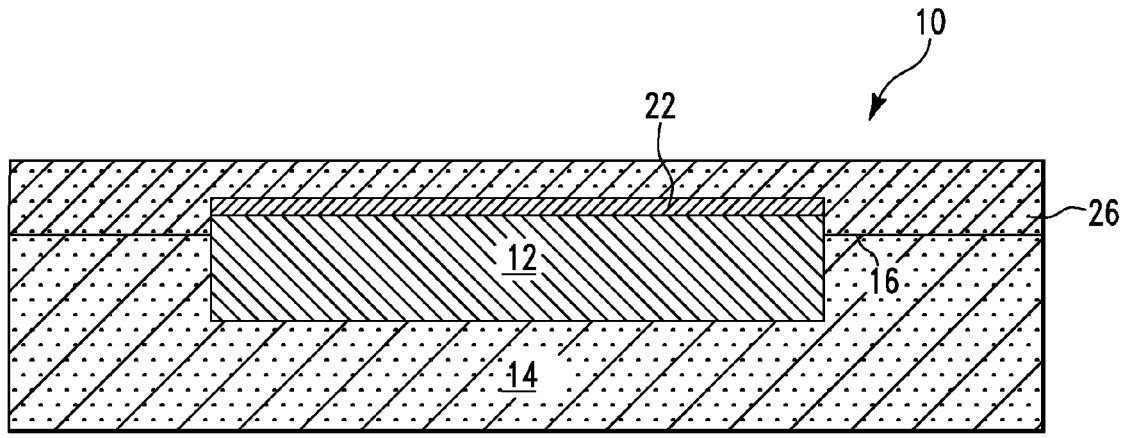
FIG. 6A depicts FIG. 5B with the dielectric capping layer replaced by a metallic capping layer, in accordance with embodiments of the present invention.

FIG. 6A depicts FIG. 5B with the dielectric capping layer 24 replaced by a metallic capping layer 22 that comprises metallic material such as, inter alia, CoWP, in accordance with embodiments of the present invention. The capping layer 22 may be a self-aligned wire capping layer, formed from a selective metal deposition, as known in the art. An example of selective metal deposition, as known in the art, is electroless plating of CoWP with 30 nm (5-100 nm range) thickness. The selective CoWP acts as a Cu wire cap diffusion barrier layer and eliminates use of a SiN or similar dielectric cap such as the dielectric capping layer 24.

Figure 6B:
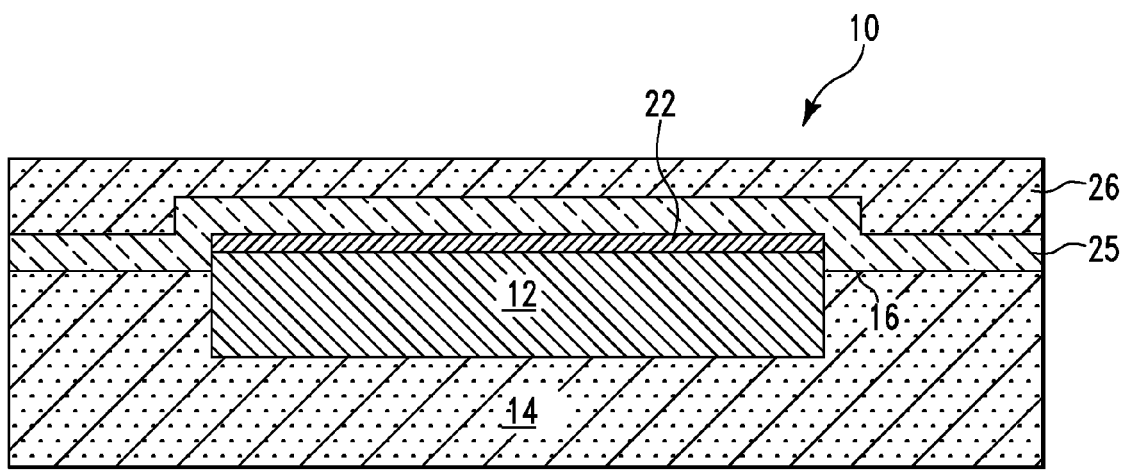
FIG. 6B depicts FIG. 6A with a dielectric capping layer over the metallic capping layer and disposed between the metallic capping layer and the second dielectric layer, in accordance with embodiments of the present invention.

FIG. 6B depicts FIG. 6A with a dielectric capping layer 25 over the metallic capping layer 22 and disposed between the metallic capping layer 22 and the second dielectric layer 26, in accordance with embodiments of the present invention. The dielectric capping layer 25 has essentially the same material and geometric properties as the capping layer 24 of FIGS. 4-6.

All embodiments of the present invention described and/or presented in Figures herein in terms of the dielectric capping layer 24 may alternatively employ the metallic capping layer 22 depicted in FIG. 6A or the combination of the metallic capping layer 22 and the dielectric capping layer 25 depicted in FIG. 6B.

Figure 7:
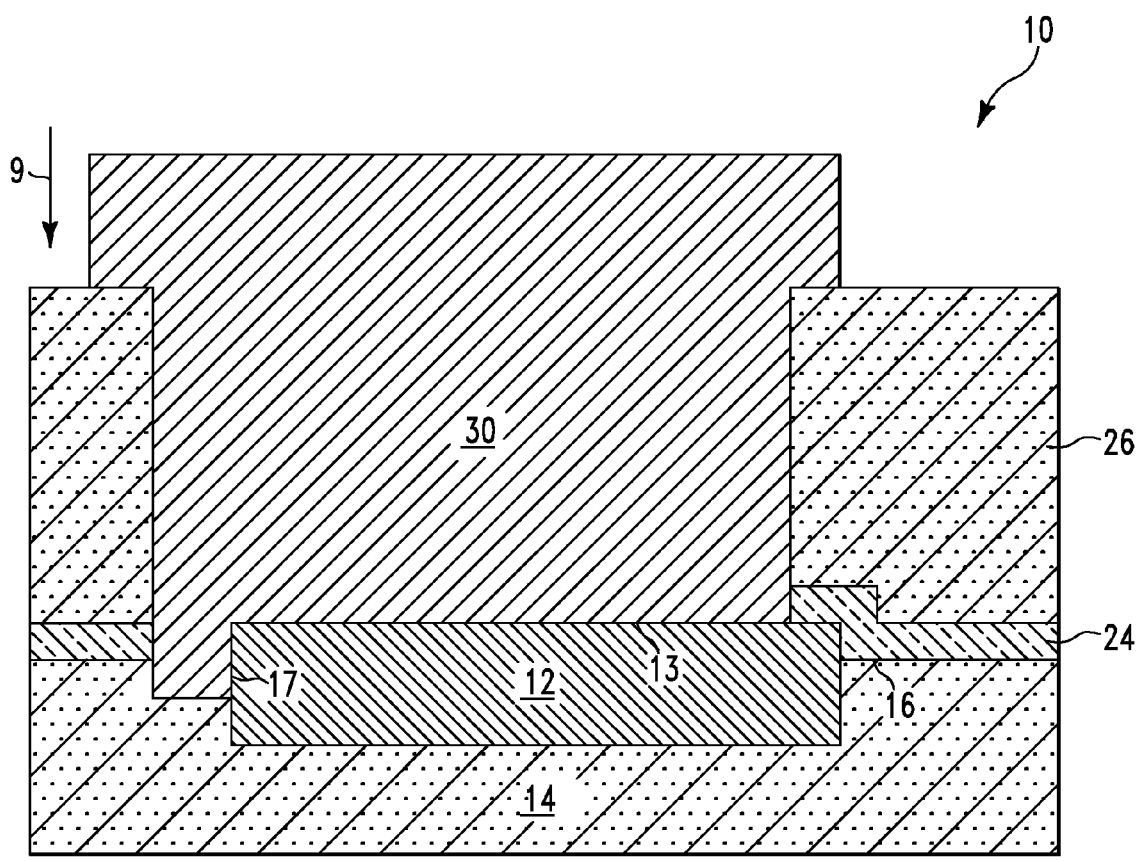
FIG. 7 depicts FIG. 5B after an electrically conductive contact has been formed on and in direct mechanical and electrical contact with the copper layer and through both the capping layer and the second dielectric layer, in accordance with embodiments of the present invention.

FIG. 7 depicts FIG. 5B after an electrically conductive contact 30 has been formed on and in direct mechanical and electrical contact with the copper layer 12 and through both the capping layer 24 and the second dielectric layer 26, in accordance with embodiments of the present invention. The contact 30 is on the top surface 28 of the second dielectric layer 26 and extends above the top surface 28. The contact 30 comprises one or more sublayers of electrically conductive material. The contact 30 could be formed either using a tapered via process, using AlCu wiring as known in the art; or a damascene tungsten stud, again, as know in the art. If a tapered via process were employed, then the film stack could consist of TaN/TiN/AlCu/TiN, TaN/TiN/Ti/AlCu/TiN, or similar stack with the refractory layers having thickness on the order of 10-100 nm and the AlCu layer having thickness ranging from 0.5 to 5 microns, as known in the art. If the contact 30 employed a damascene tungsten process, then it would be comprised of a thin (~10-50 nm) layer of a refractory film such as TiN with the rest of the contact being composed of tungsten, as known in the art. In one embodiment, the contact 30 comprises a first sublayer comprising a refractory metal (tungsten stud) in direct mechanical contact with the copper wire 12, a second sublayer comprising aluminum copper (AlCu) on the first sublayer, and additional sublayers comprising refractory metals on the second sublayer (by using a tapered via process as known in the art).

The contact 30 may be formed by, inter alia, performing a subtractive etch through the second dielectric layer 26, the capping layer 14, and a top portion of the first dielectric layer 14 (if the contact extends into the first dielectric layer 14 as shown) to form a via, followed by depositing the electrically conductive material of the contact 30 in the via and on the surface 28 of the second dielectric layer 26 to form the contact 30 such as by physical vapor deposition (PVD), atomic layer deposition (ALD), or chemical vapor deposition (CVD).

FIG. 7 depicts a first portion of the contact 30 being top-landed on the top surface 13 of the copper layer 12 and a second portion of the contact 30 being side-landed on a sidewall 17 of the copper layer 12, wherein the sidewall 17 is perpendicular to the top surface 13 and corresponds to the perimeter surface 18 (see FIG. 2).

Figure 8A:
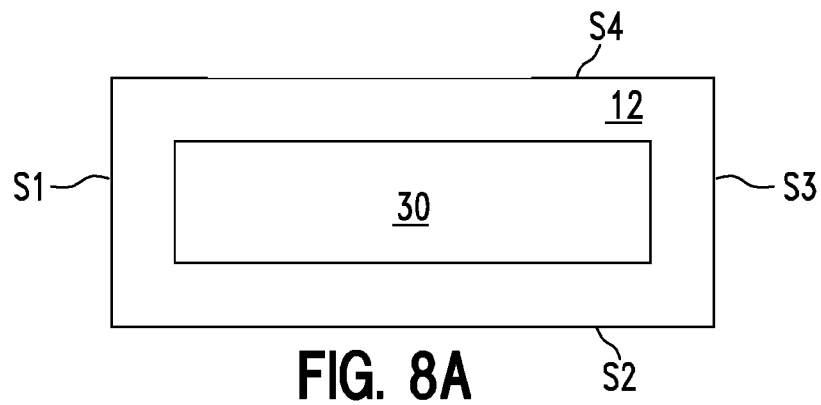
FIGS. 8A, 8B, 8C, and 8D are top views of the electrically conductive contact on the top surface of the copper layer in FIG. 7, in accordance with embodiments of the present invention.
Figure 8B:
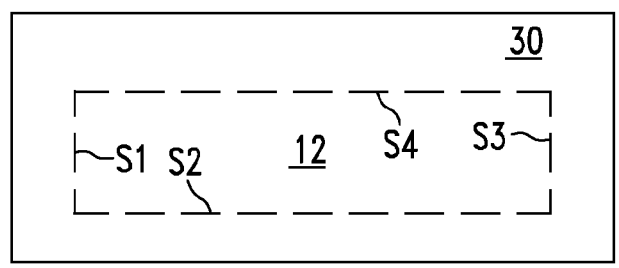
Figure 8C:
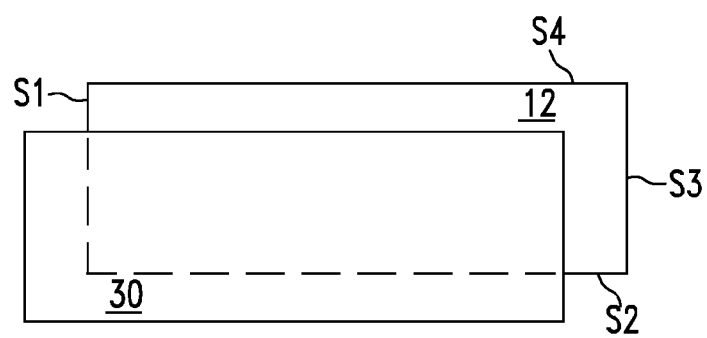
Figure 8D:
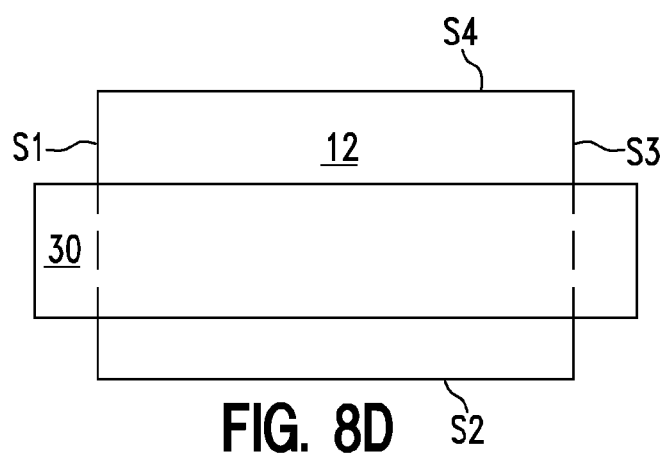

FIGS. 8A, 8B, 8C, and 8D are top views of the contact 30 on the top surface 13 of the copper layer 12 in FIG. 7, in accordance with embodiments of the present invention. The top views in FIGS. 8A, 8B, 8C, and 8D are views in the direction 9 (see FIG. 7). In FIG. 8A, the contact 30 is top-landed on the top surface 13 of the copper layer 12 and is not side-landed at all on the copper wire 12. In FIG. 8B, the contact 30 is top-landed on the top surface 13 of the copper layer 12 and is side-landed on all four sides (S1, S2, S3, S4) of the copper wire 12. In FIG. 8C, the contact 30 is top-landed on the top surface 13 of the copper layer 12 and is side-landed on only adjacent sides S1 and S2 of the copper wire 12. In FIG. 8D, the contact 30 is top-landed on the top surface 13 of the copper layer 12 and is side-landed on only opposite sides S1 and S3 of the copper wire 12. Generally, the contact 30 is top-landed on the top surface 13 of the copper layer 12 and may be either not side-landed or is selectively side-landed on one to all sides of the copper wire 12 in any combination of sides of the copper wire 12.

Although FIG. 7 depicts the contact 30 in electrically conductive contact with the copper wire 12, the scope of the present invention includes embodiments in which the copper wire 12 may appear in the substrate 10 with the contact 30 as in FIG. 7 or without the contact 30 as in FIG. 5B.

Figure 9:
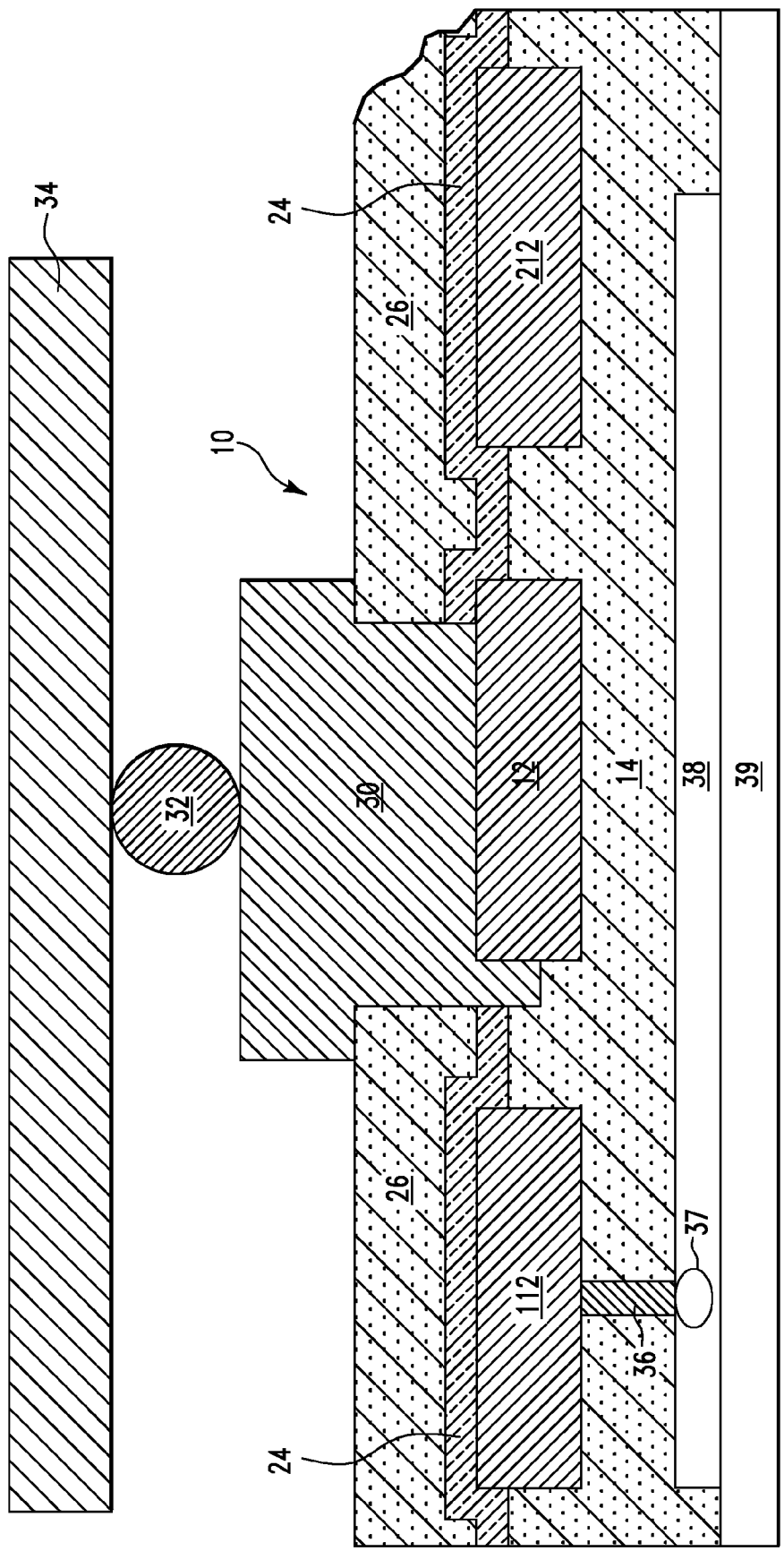
FIG. 9 illustrates the substrate of FIG. 7 with added copper wires in direct mechanical contact with the capping layer, in accordance with embodiments of the present invention.

FIG. 9 illustrates the substrate 10 of FIG. 7 with the copper wire 12 and added copper wires 112 and 212 in direct mechanical contact with the capping layer 24, in accordance with embodiments of the present invention. The copper wire 12 is being used as a contact conductor that is in electrically conductive contact with the contact 30, and the contact 30 is electrically coupled to a substrate 34 via an electrically conductive interconnect 32. In one embodiment, the substrate 34 comprises a chip carrier and the electrically conductive interconnect 32 comprises a controlled collapse chip connection (C4) solder ball. In FIG. 9, the copper wire 12 is used as a contact conductor that is electrically and mechanically connected to the contact 30 and thus electrically coupled to the external substrate 34.

The copper wires 112 and 212 are configured in a similar manner as is the copper wire 12 in FIG. 5B except that the copper wires 112 and 222 are not in electrical and mechanical contact with the contact 30 or a similar contact. In one embodiment, the copper wire 112 is used as a wiring level conductor that is electrically coupled by an electrically conductive wiring path 36 to at least one electrical device 37 within a device layer 38 of the substrate 10, wherein the device layer is above a semiconductor layer 39 such as a silicon layer. In one embodiment, the copper wire 212 is used as a laser fuse conductor that is configured to be partially vaporized by a laser beam to break an electrical circuit within the substrate 10, as known in the art.

The substrate 10 may comprise any combination of any number of such contact conductors, wiring level conductors, and laser fuse conductors in direct mechanical contact with the capping layer 24. The contact conductors, wiring level conductors, and laser fuse conductors may be spatially sequenced in any manner within the substrate 10. For example, FIG. 9 depicts the copper wire 12 (contact conductor) disposed between the copper wire 112 (wiring level conductor) and the copper wire 222 (laser fuse conductor). As another example, N1 laser fuse conductors are disposed between N2 contact conductors and N3 wiring level conductors, wherein N1, N2, and N3 are each independently at least 1 (e.g., N1=4, N2=2, N3=6). As another example, the contact conductors, wiring level conductors, and laser fuse conductors may be spatially sequenced randomly within the substrate 10.

FIG. 10A depicts a cross-sectional view of copper wires 91-95 in contact with the capping layer 24, in accordance with embodiments of the present invention. Copper wire 91 is a contact conductor. Copper wires 92-94 are wiring level conductors. Copper wire 95 is a laser fuse conductor. FIG. 10B is a top cross-section view through line 10B-10B of FIG. 10A.

The recess depths used to form the recesses 20 (see FIG. 2) and associated capping layer 24 portions around each conductor of the contact conductors, wiring level conductors, and laser fuse conductors in the substrate 10 may have any spatial configuration of recess depths. independently for each such recess as has been described supra for the recess 20 of FIG. 2.

In one embodiment, the capping layer 24 is formed concurrently for all contact conductors, wiring level conductors, and laser fuse conductors in the substrate 10.

If the substrate 10 comprises a plurality of contacts 30, each such contact 30 may be independently top-landed and/or side-landed on its associated contact conductor (i.e., copper wire 12) in any top-landed and/or side-landed configuration described supra for the contact 30 of FIGS. 7 and 8A-8D.

Figure 11:
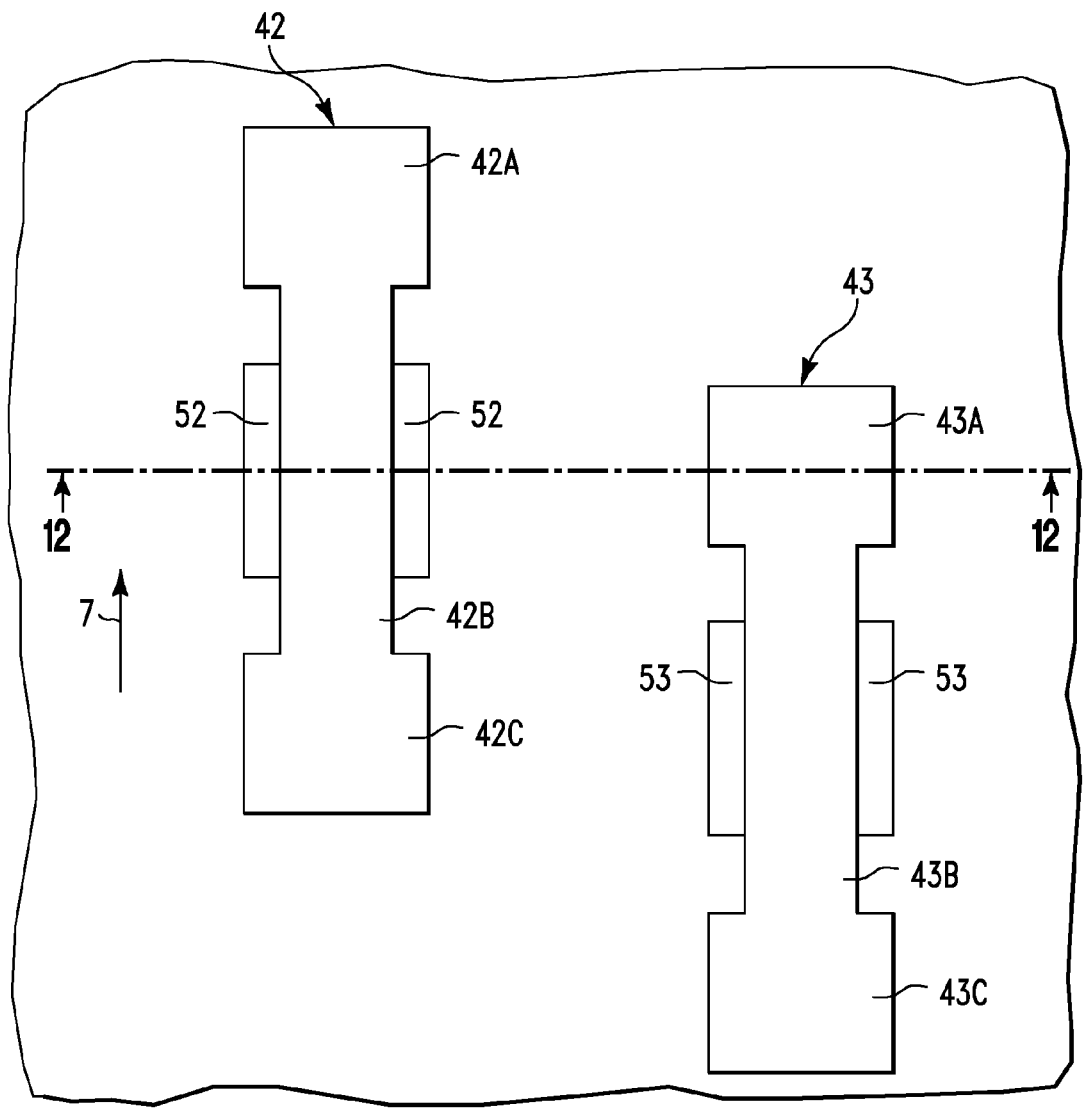
FIG. 11 depicts a top view of two copper wires having recess depths in different locations.
Figure 12:
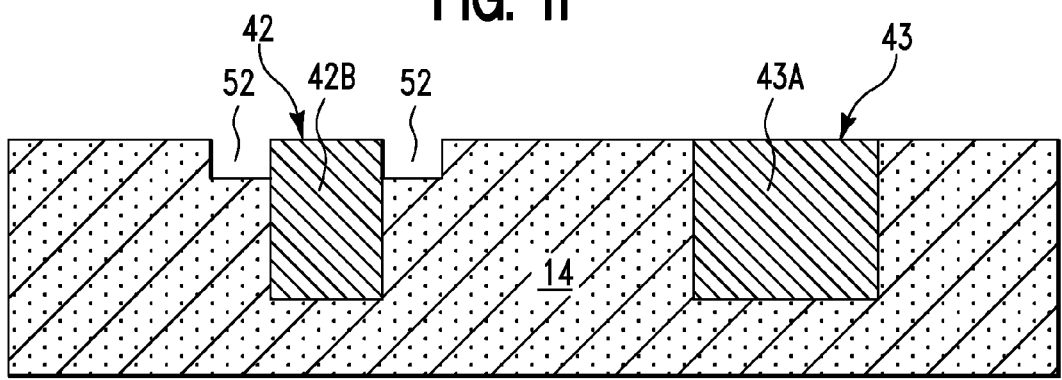
FIG. 12 depicts a cross-sectional view through line 12A-12A of FIG. 11, in accordance with embodiments of the present invention.

FIG. 11 depicts a top view of copper wires 42 and 43 having recess depths in different locations, and FIG. 12 depicts a cross-sectional view through line 12-12 of FIG. 11, in accordance with embodiments of the present invention.

Copper wire 42, which represents a laser fuse conductor having a dogbone shape, comprises regions 42A, 42B, and 42C. Region 42B, which is surrounded by recess 52, is configured to be subsequently blown in a fuse blow procedure to open region 42B mechanically and electrically to create an open circuit. The recess 52 is visible in both the top view of FIG. 11 and the cross-sectional view of FIG. 12, because the line 12-12 in FIG. 11 traverses the recess 52.

Copper wire 43, which represents a laser fuse conductor having a dogbone shape, comprises regions 43A, 43B, and 43C. Region 43B, which is surrounded by recess 53, is configured to be subsequently blown in a fuse blow procedure to open region 43B mechanically and electrically to create an open circuit. The recess 53 is visible in the top view of FIG. 11 but is not visible in the cross-sectional view of FIG. 12, because the line 12-12 in FIG. 11 does not traverse the recess 53.

Thus, recesses 52 and 53 were formed in a spatial selective manner, resulting in the recesses 52 and 53 being in different spatial locations in the direction 7.

Although copper wires 42 and 43 are depicted in FIGS. 11 and 12 as laser fuse conductors, in various embodiments the copper wires 42 and 43 may each independently be a contact conductor, a wiring level conductor, or a laser fuse conductor, with any configuration of spatially selective recessing for copper wires 42 and 43.

Note that FIGS. 11 and 12 are analogous to FIGS. 2A and 2B in that the capping layer 24 and the second dielectric layer 26 have not yet been formed, but will subsequently be formed. (e.g., as in FIG. 5B).

Figure 13:
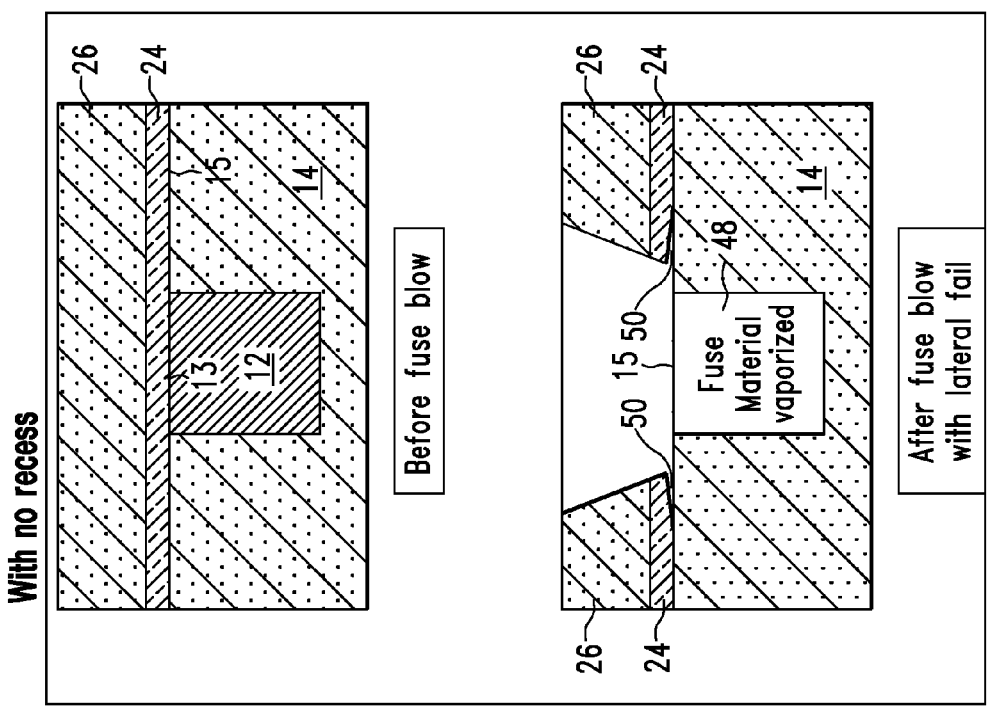
FIG. 13 depicts a lateral fail resulting from a fuse blow if the recess in FIG. 2 is absent.

FIG. 13 depicts a lateral fail resulting from a fuse blow if the recess of depth D in FIG. 2 is absent (i.e., D=0). In FIG. 13, the top surface 13 of the copper wire 12 is essentially coplanar with the top surface 15 of the first dielectric layer 14 as in FIG. 1. The fuse blow vaporizes a portion of the copper wire 12 to create a region 48 in which the fuse material of the copper wire 12 has been vaporized. The stresses on the copper wire 12 resulting from the fuse blow are distributed along the top surface 13 of the copper wire 12. These stresses cause the capping layer 24 to be delaminated from the top surface 15 of the first dielectric layer 14 to create a lateral fail in the form of an angular gap 50 between the capping layer 24 and the top surface 15 of the first dielectric layer 14 as shown. The angular gap 50 comprises an acute angle exceeding zero degrees between the capping layer 24 and the top surface 15 of the first dielectric layer 14. The angular gap 50 is an adverse structural defect in the substrate 10.

Figure 14:
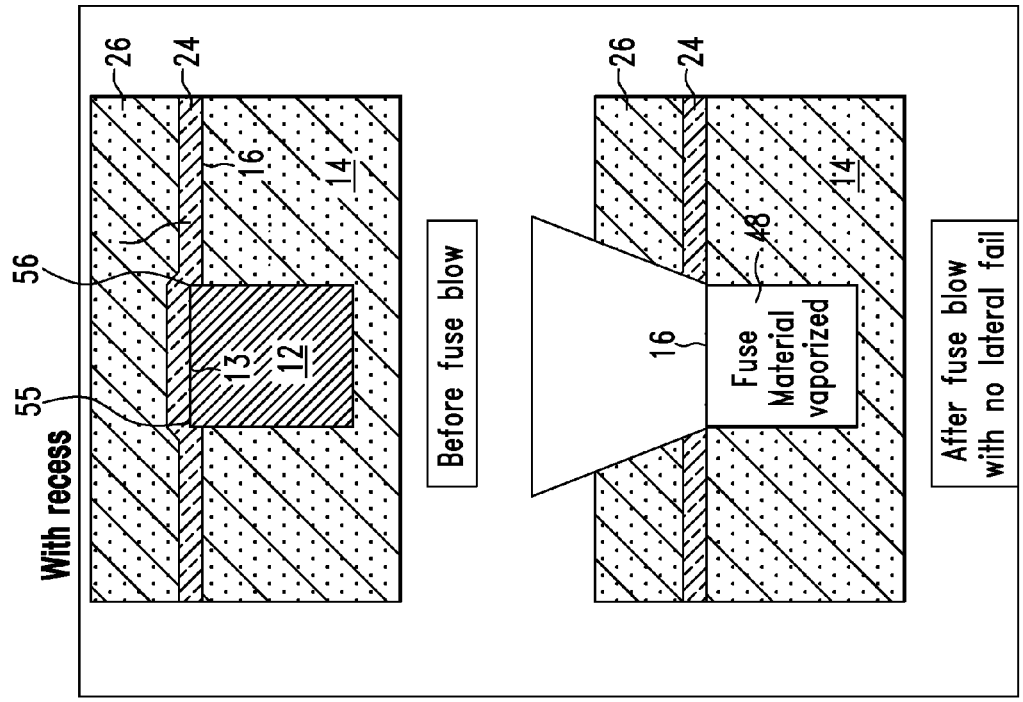
FIG. 14 depicts prevention of the lateral fail of FIG. 13, said prevention due to the existence of the recess in FIG. 2, in accordance with embodiments of the present invention.

FIG. 14 depicts prevention of the lateral fail of FIG. 13, said prevention due to the existence of the recess of recess depth D in FIG. 2, in accordance with embodiments of the present invention. With finite recess depth D exceeding zero, the top surface 13 of the copper wire 12 is above the top surface 16 of the first dielectric layer 14 as if FIG. 1. A fuse blow vaporizes a portion of the copper wire 12 and a portion of the capping layer 24 to create the region 48 in which the fuse material of the copper wire 12 has been vaporized. A portion of the stresses on the copper wire 12 resulting from the fuse blow have been shifted by the recess to the ends 55 and 56 of the copper wire 12. The higher stress concentrations of stress at the ends 55 and 56 causes the capping layer to snap and break sharply and cleanly from the top surface 13 of the copper wire 12, such that the lateral fail and associated angular gap 50 in FIG. 13 does not occur with the configuration of FIG. 14. Thus, the recess of recess depth D in FIG. 2 prevents the lateral fail that occurs with the configuration of FIG. 13.

The recess depth D prevents a lateral fail (on the contact conductors, wiring level conductors, and laser fuse conductors) that would otherwise result from stresses during operation (e.g., laser fuse blowing) and/or packaging of the substrate 10.

Figure 15:
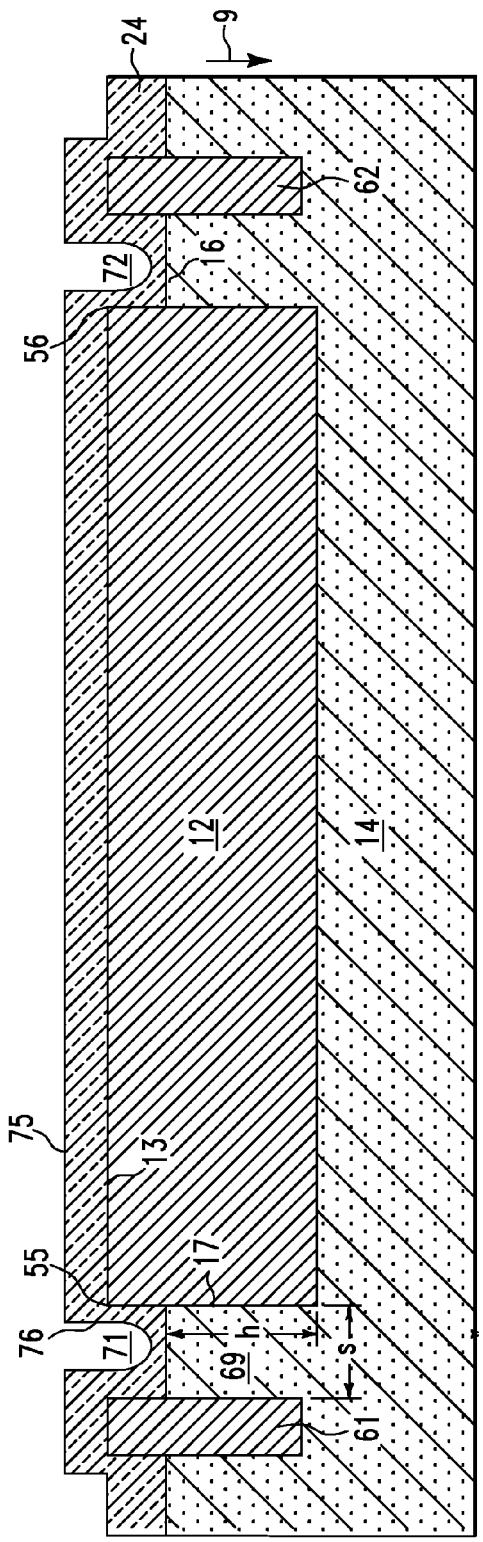
FIG. 15 depicts a modification of FIG. 4 in which dummy shapes comprising copper have been formed in the first dielectric layer and the capping layer, in accordance with embodiments of the present invention.

FIG. 15 depicts a modification of FIG. 4 in which dummy shapes 61 and 62 comprising copper have been formed in the first dielectric layer 14 and the capping layer 24, in accordance with embodiments of the present invention. The dummy shapes 61 and 62 may be formed in the same manner as the copper wire 12 is formed as has been described supra. In one embodiment, the dummy shapes 61 and 62 may be formed concurrently with the copper wire 12. The dummy shapes 61 and 62 extend in the direction 9 to at least the same depth below the top surface 13 of the copper wire 12 into the first dielectric layer 14. In one embodiment, the dummy shapes 61 and 62 extend in the direction 9 to about the same depth below the top surface 13 of the copper wire 12 into the first dielectric layer 14. The dummy shapes are electrically isolated within the substrate 10.

The dummy shape shapes 61 and 62 create a region 69 characterized by a height (h) and a separation (s) between the dummy shape 61 (or 62) and the copper wire 12. The region 69 is characterized by an aspect ratio equal to h/s. If the aspect ratio is sufficiently large, open voids 71 and 72 will form as the capping layer 24 is deposited with poor conformality on the copper wire 12. Poor conformality with respect to formation of the open voids 71 and 72 exists if the capping material of the capping layer 24 deposits at a faster volumetric rate on the top wall 13 than on the sidewall 17 of the copper wire 12. Aspect ratios of at least about 0.5:1 or greater (height:width; i.e., h/s) are sufficiently large to cause formation of the open voids 71 and 72 under conditions of poor conformality. For example, the aspect ratio may be about 2.

The scope of the present invention includes a distribution of dummy shapes that circumscribe the perimeter surface 18 (see FIG. 2) of the copper wire 12 in any spatially distributed pattern. Note that the perimeter surface 18 of FIG. 2 includes the sidewalls 17 depicted in FIG. 15.

Figure 16:
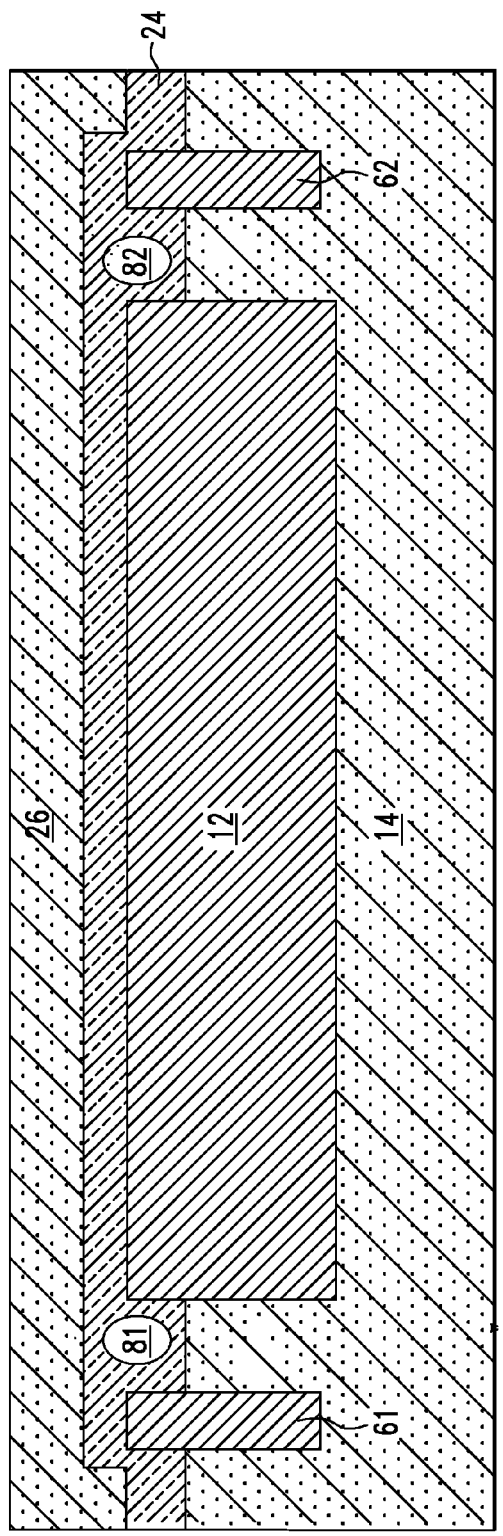
FIG. 16 depicts FIG. 15 after the second dielectric layer has been formed on the capping layer, in accordance with embodiments of the present invention.

FIG. 16 depicts FIG. 15 after the second dielectric layer 26 has been formed on the capping layer 24 with poor conformality, in accordance with embodiments of the present invention. As a result of the formation of the second dielectric layer 26 on the capping layer 24 with poor conformality, the open voids 71 and 72 in FIG. 15 are closed by the dielectric material of the second dielectric layer 26 to become closed voids 81 and 82, respectively, in FIG. 16. PVD and PECVD dielectrics, including $SiO_2$ and SiN, generally have poor conformality. Poor conformality with respect to formation of the closed voids 81 and 82 exists if the dielectric material of the second dielectric layer 26 adjacent to the capping layer 24 deposits at a faster volumetric rate on the top wall 75 than on the sidewall 76 of the capping layer 24.

The closed voids 81 and 82 are useful for further preventing the lateral fail described supra in relation to FIGS. 12 and 13 for an embodiment in which the copper wire 12 is a laser fuse conductor. In particular, the closed voids 81 and 82 serve to shift stresses to the corners 51 and 52 of the copper wire 12 during a fuse blow, which promotes a clean and sharp break of the capping layer 24 from the copper wire 12, such that the lateral fail and associated gap 50 in FIG. 13 does not occur as described supra.

FIGS. 17-22 depict a top view of various dummy shape patterns around the perimeter surface 18 of the copper wire 12 of FIGS. 15-16, in accordance with embodiments of the present invention. The dummy shapes patterns are electrically isolated within the substrate 10.

In FIGS. 17-22, the copper wire 12 has a rectangular shape with four sides. The top view of FIGS. 17-22 is in the direction 9 of FIG. 16. FIGS. 17-22 each comprise a region 73 surrounding the copper wire 12, wherein the region 73 comprises void (i.e., the open void(s) 71/72 of FIG. 15 or the closed void 81/82 of FIG. 16) surrounded by the capping material of the capping layer 24 that is disposed between the dummy shape(s) and the copper wire 12 in FIGS. 15-16.

Figure 17:
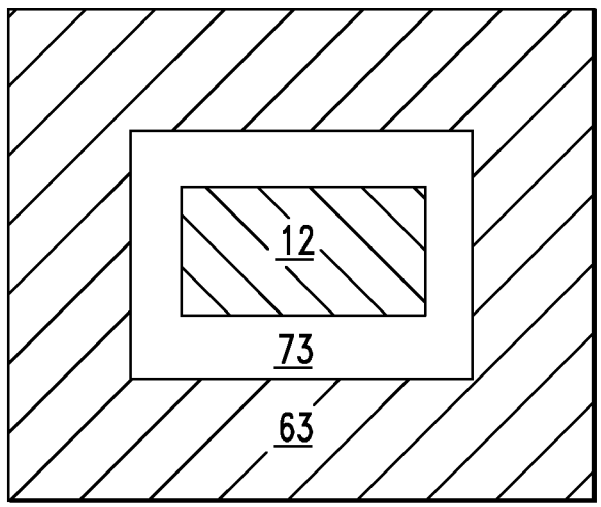
FIGS. 17-22 depict a top view of various dummy shape spatial distributions around a perimeter surface of the copper wire of FIGS. 15-16, in accordance with embodiments of the present invention.

In one embodiment illustrated in FIG. 17, the dummy shape pattern 63 is continuously distributed around all four sides of the copper wire 12.

Figure 18:
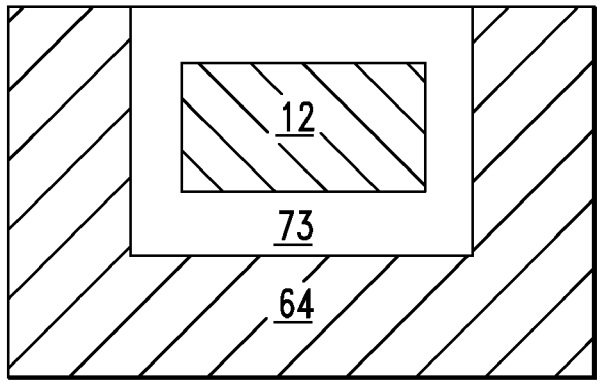

In one embodiment illustrated in FIG. 18, the dummy shape pattern 64 is continuously distributed around only three sides the copper wire 12.

Figure 19:
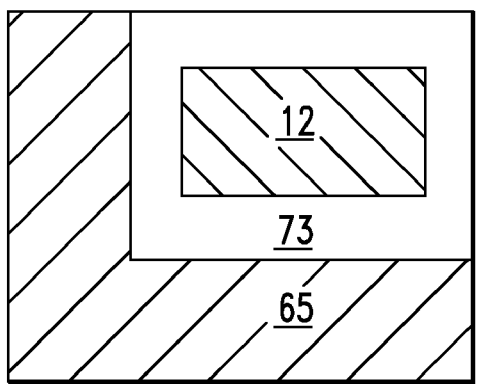

In one embodiment illustrated in FIG. 19, the dummy shape pattern 66 is continuously distributed around only two sides the copper wire 12.

Figure 20:
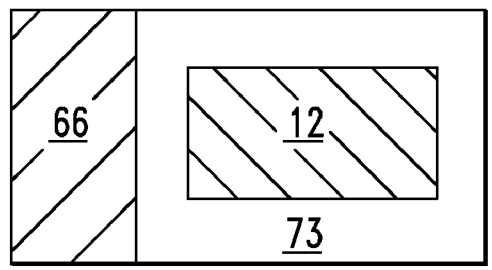

In one embodiment illustrated in FIG. 20, the dummy shape pattern 66 is continuously distributed along only one side the copper wire 12.

Figure 21:
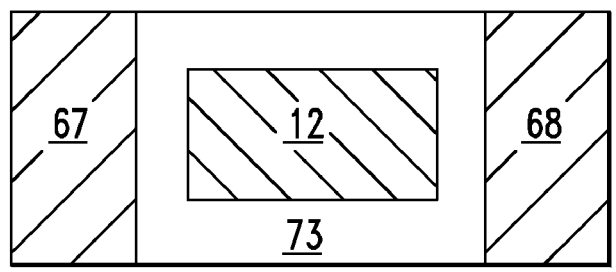
Figure 22:
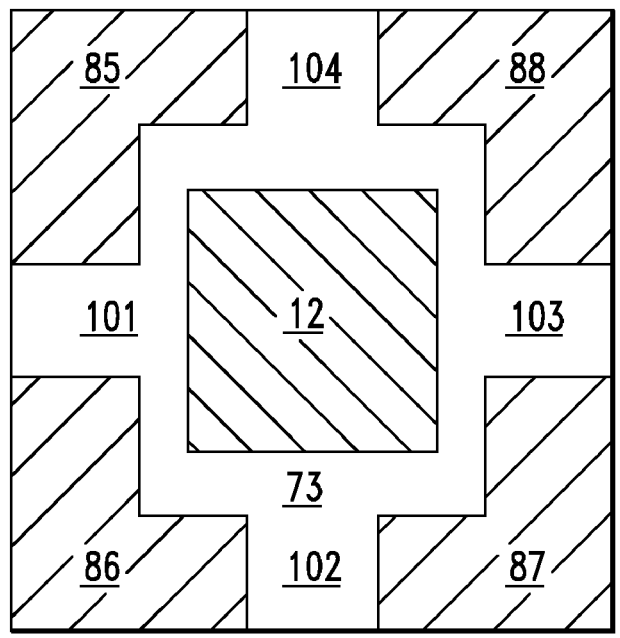

In one embodiment, the dummy shape pattern is discontinuously distributed around the perimeter surface 18 such that one or more gaps exist in the dummy shape pattern, as illustrated in FIGS. 21 and 22.

FIG. 21 depicts a dummy shape having a first portion 67 along a first side of the copper wire 12 and a second portion 68 along a second side of the copper wire 12, wherein the first and second sides are opposite and parallel to each other.

FIG. 22 depicts a dummy shape surrounding the copper wire 12, wherein the dummy shape has portions 85-88. The discontinuities in the dummy shape of FIG. 22 comprise the gaps 101-104 at the center of the four sides of the copper wire 12. More specifically, gap 101 is between portions 85 and 86, gap 102 is between portions 86 and 87, gap 103 is between portions 87 and 88, and gap 104 is between portions 88 and 85.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure, comprising:
   a substrate that comprises a first dielectric layer that includes a first dielectric material;
   at least one copper wire, each copper wire within the first dielectric layer and extending above the first dielectric layer by a recess depth, wherein each copper wire comprises copper;
   a recess having the recess depth from the top surface of each copper wire to a top surface of the first dielectric layer such that the recess surrounds and is in direct mechanical contact with a perimeter surface of each copper wire, wherein the recess depth is less than a thickness of each copper wire in a direction perpendicular to the top surface of each copper wire;
   a capping layer in the recess and on the top surface of each copper wire and on the top surface of the first dielectric layer;
   a second dielectric layer comprising one or more dielectric sublayers on and in direct mechanical contact with the capping layer, wherein each dielectric sublayer comprises a dielectric material that is specific to each dielectric sublayer, wherein the capping layer comprises a capping material configured to prevent copper of each copper wire from passing through the capping layer into the second dielectric layer;
   wherein the recess depth has a magnitude sufficient to prevent a lateral fail of the capping layer during packaging and/or operation of the substrate;

wherein the lateral fail comprises a delamination of a portion of the capping layer from the first dielectric layer;

wherein the delamination is characterized by an angular gap comprising an acute angle exceeding zero degrees between the capping layer and the top surface of the first dielectric layer;

wherein the recess depth is not constant around the perimeter surface of a first copper wire of the at least one copper wire.

2. A structure, comprising:

a substrate that comprises a first dielectric layer that includes a first dielectric material;

at least one copper wire, each copper wire within the first dielectric layer and extending above the first dielectric layer by a recess depth, wherein each copper wire comprises copper;

a recess having the recess depth from the top surface of each copper wire to a top surface of the first dielectric layer such that the recess surrounds and is in direct mechanical contact with a perimeter surface of each copper wire, wherein the recess depth is less than a thickness of each copper wire in a direction perpendicular to the top surface of each copper wire;

a capping layer in the recess and on the top surface of each copper wire and on the top surface of the first dielectric layer;

a second dielectric layer comprising one or more dielectric sublayers on and in direct mechanical contact with the capping layer, wherein each dielectric sublayer comprises a dielectric material that is specific to each dielectric sublayer, wherein the capping layer comprises a capping material configured to prevent copper of each copper wire from passing through the capping layer into the second dielectric layer;

wherein the recess depth has a magnitude sufficient to prevent a lateral fail of the capping layer during packaging and/or operation of the substrate;

wherein the lateral fail comprises a delamination of a portion of the capping layer from the first dielectric layer;

wherein the delamination is characterized by an angular gap comprising an acute angle exceeding zero degrees between the capping layer and the top surface of the first dielectric layer;

wherein the structure further comprises: a dummy shape pattern that is distributed within the first dielectric layer in a spatial distribution around a perimeter surface of a first copper wire of the at least one copper wire, wherein the dummy shape pattern comprises copper, wherein a top surface of the dummy shape pattern is coplanar with the top surface of the first copper wire, wherein the dummy shape pattern extends from the top surface of the first copper wire about at least as far into the first dielectric layer as does the first copper wire, wherein the dummy shape pattern is electrically isolated within the substrate;

wherein a first portion of the recess is disposed between the dummy shape and the first copper wire to define a first region below the recess between the dummy shape pattern and the first copper wire such that a top surface of the first region is at the recess depth below the top surface of the dummy shape, wherein the first region has a width (s) between the dummy shape pattern and the first copper wire and a height (h) between the top surface of the capping layer and a bottom surface of the first copper wire, and wherein an aspect ratio (h/s) of the first region is at least 0.5;

wherein the recess comprises a closed void circumscribed by the capping material and the dielectric material of the second dielectric layer within the recess.

3. The structure of claim 2, wherein the recess depth is in a range of 50 to 200 nanometers for each copper wire.

4. The structure of claim 2, wherein the dummy shape pattern is distributed continuously around the perimeter surface of the first copper wire, and wherein the dummy shape pattern totally surrounds the perimeter surface of the first copper wire.

5. The structure of claim 2, wherein the dummy shape pattern is distributed continuously around the perimeter surface of the first copper wire, and wherein the dummy shape pattern partially but not completely surrounds the perimeter surface of the first copper wire.

6. The structure of claim 2, wherein the dummy shape pattern is distributed discontinuously around perimeter surface of the first copper wire such that a plurality of gaps exist in the distribution of the dummy shape pattern around the perimeter surface of the first copper wire.

7. The structure of claim 2, wherein the at least one copper wire comprises a first copper wire consisting of a contact conductor, wherein the structure further comprises an electrically conductive contact on and in direct mechanical and electrical contact with the first copper wire and through the capping layer, wherein the contact is on and in direct mechanical contact with a top surface of the second dielectric layer and extends above the top surface of the second dielectric layer, and wherein the contact is configured to be electrically connected to another substrate via an electrically conductive interconnect.

8. A structure, comprising:

a substrate that comprises a first dielectric layer that includes a first dielectric material;

at least one copper wire, each copper wire within the first dielectric layer and extending above the first dielectric layer by a recess depth, wherein each copper wire comprises copper;

a recess having the recess depth from the top surface of each copper wire to a top surface of the first dielectric layer such that the recess surrounds and is in direct mechanical contact with a perimeter surface of each copper wire, wherein the recess depth is less than a thickness of each copper wire in a direction perpendicular to the top surface of each copper wire;

a capping layer in the recess and on the top surface of each copper wire and on the top surface of the first dielectric layer;

a second dielectric layer comprising one or more dielectric sublayers on and in direct mechanical contact with the capping layer, wherein each dielectric sublayer comprises a dielectric material that is specific to each dielectric sublayer, wherein the capping layer comprises a capping material configured to prevent copper of each copper wire from passing through the capping layer into the second dielectric layer;

wherein the recess depth has a magnitude sufficient to prevent a lateral fail of the capping layer during packaging and/or operation of the substrate;

wherein the lateral fail comprises a delamination of a portion of the capping layer from the first dielectric layer;

wherein the delamination is characterized by an angular gap comprising an acute angle exceeding zero degrees between the capping layer and the top surface of the first dielectric layer;

wherein the at least one copper wire further comprises a first copper wire consisting of a laser fuse conductor, wherein the first copper wire is configured to be fuse blown to vaporize a portion of the first copper wire and a portion of the capping layer to create a vaporization region in which the portion of the first copper wire has been vaporized and in which an electrical open in the first copper wire has been generated such that said lateral fail of the capping layer does not result from the first copper wire being fuse blown.

9. The structure of claim 8,
wherein the at least one copper wire further comprises a second copper wire consisting of a contact conductor and a third copper wire consisting of a wiring level conductor;
wherein the structure further comprises an electrically conductive contact on and in direct mechanical and electrical contact with the second copper wire and through the capping layer, wherein the contact is on and in direct mechanical contact with a top surface of the second dielectric layer and extends above the top surface of the second dielectric layer, and wherein the contact is configured to be electrically connected to another substrate via an electrically conductive interconnect;
wherein the third copper wire is electrically coupled to at least one electrical device within a device layer of the substrate by an electrically conductive wiring path within the substrate.

10. A method for forming a structure, comprising:
providing a substrate that comprises a first dielectric layer, wherein the first dielectric layer comprises a first dielectric material;
forming at least one copper wire within the first dielectric layer such that a top surface of each copper wire is essentially coplanar with a top surface of the first dielectric layer, wherein each copper wire comprises copper;
after said forming the at least one copper wire, forming a recess in the first dielectric layer from the top surface of each copper wire to a recess depth within the first dielectric layer such that the recess surrounds and is in direct mechanical contact with a perimeter surface of each copper wire, wherein the recess depth is less than a thickness of each copper wire in a direction perpendicular to the top surface of each copper wire, and wherein each copper wire is within the first dielectric layer and extends above the first dielectric layer by the recess depth;
after said forming the recess, forming a capping layer in the recess and on the top surface of each copper wire and on the top surface of the first dielectric layer;
forming a second dielectric layer comprising one or more dielectric sublayers on and in direct mechanical contact with the capping layer, wherein each dielectric sublayer comprises a dielectric material that is specific to each dielectric sublayer, wherein the capping layer comprises a dielectric capping material configured to prevent copper of each copper wire from passing through the capping layer into the second dielectric layer;
wherein the recess depth has a magnitude sufficient to prevent a lateral fail of the capping layer during packaging and/or operation of the substrate;
wherein the lateral fail comprises a delamination of a portion of the capping layer from the first dielectric layer;
wherein the delamination is characterized by an angular gap comprising an acute angle exceeding zero degrees between the capping layer and the top surface of the first dielectric layer;
wherein the recess depth is not constant around the perimeter surface of a first copper wire of the at least one copper wire.

11. A method for forming a structure, comprising:
providing a substrate that comprises a first dielectric layer, wherein the first dielectric layer comprises a first dielectric material;
forming at least one copper wire within the first dielectric layer such that a top surface of each copper wire is essentially coplanar with a top surface of the first dielectric layer, wherein each copper wire comprises copper;
after said forming the at least one copper wire, forming a recess in the first dielectric layer from the top surface of each copper wire to a recess depth within the first dielectric layer such that the recess surrounds and is in direct mechanical contact with a perimeter surface of each copper wire, wherein the recess depth is less than a thickness of each copper wire in a direction perpendicular to the top surface of each copper wire, and wherein each copper wire is within the first dielectric layer and extends above the first dielectric layer by the recess depth;
after said forming the recess, forming a capping layer in the recess and on the top surface of each copper wire and on the top surface of the first dielectric layer;
forming a second dielectric layer comprising one or more dielectric sublayers on and in direct mechanical contact with the capping layer, wherein each dielectric sublayer comprises a dielectric material that is specific to each dielectric sublayer, wherein the capping layer comprises a dielectric capping material configured to prevent copper of each copper wire from passing through the capping layer into the second dielectric layer;
wherein the recess depth has a magnitude sufficient to prevent a lateral fail of the capping layer during packaging and/or operation of the substrate;
wherein the lateral fail comprises a delamination of a portion of the capping layer from the first dielectric layer;
wherein the delamination is characterized by an angular gap comprising an acute angle exceeding zero degrees between the capping layer and the top surface of the first dielectric layer;
wherein the method further comprises: forming a dummy shape pattern that is distributed within the first dielectric layer in a spatial distribution around a perimeter surface of a first copper wire of the at least one copper wire, wherein the dummy shape pattern comprises copper, wherein a top surface of the dummy shape pattern is coplanar with the top surface of the first copper wire, wherein the dummy shape pattern extends from the top surface of the first copper wire about at least as far into the first dielectric layer as does the first copper wire, wherein the dummy shape pattern is electrically isolated within the substrate, and wherein said forming the first copper wire and said forming the dummy shape pattern are performed concurrently;
wherein said forming the recess results in a first portion of the recess being disposed between the dummy shape and the first copper wire to define a first region below the recess between the dummy shape pattern and the first copper wire such that a top surface of the first region is at the recess depth below the top surface of the dummy shape, wherein the first region has a width (s) between the dummy shape pattern and the first copper wire and a height (h) between the top surface of the capping layer after said recess has been formed and a bottom surface of the first copper wire, and wherein an aspect ratio (h/s) of the first region is at least 0.5;

wherein said forming the capping layer comprises depositing the capping layer into the first portion of the recess with sufficiently poor conformality that an open void within the capping material in the first portion of the recess is formed;

wherein said forming the second dielectric layer comprises depositing the second dielectric layer into the open void with sufficiently poor conformality that a closed void is formed from the open void by covering an opening in the open void with the dielectric material of the second dielectric layer;

wherein the closed void is circumscribed by the capping material and the dielectric material of the second dielectric layer within the recess.

12. The method of claim 11, wherein the recess depth is in a range of 50 to 200 nanometers for each copper wire.

13. The method of claim 11, wherein the dummy shape pattern is distributed continuously around the perimeter surface of the first copper wire, and wherein the dummy shape pattern totally surrounds the perimeter surface of the first copper wire.

14. The method of claim 11, wherein the dummy shape pattern is distributed continuously around the perimeter surface of the first copper wire, and wherein the dummy shape pattern partially but not completely surrounds the perimeter surface of the first copper wire.

15. The method of claim 11, wherein the dummy shape pattern is distributed discontinuously around perimeter surface of the first copper wire such that a plurality of gaps exist in the distribution of the dummy shape pattern around the perimeter surface of the first copper wire.

16. The method of claim 11, wherein the at least one copper wire comprises a first copper wire consisting of a contact conductor, and wherein the method further comprises:

forming an electrically conductive contact on and in direct mechanical and electrical contact with the first copper wire and through the capping layer, wherein the contact is on and in direct mechanical contact with a top surface of the second dielectric layer and extends above the top surface of the second dielectric layer, and wherein the contact is configured to be electrically connected to another substrate via an electrically conductive interconnect.

17. A method for forming a structure, comprising:

providing a substrate that comprises a first dielectric layer, wherein the first dielectric layer comprises a first dielectric material;

forming at least one copper wire within the first dielectric layer such that a top surface of each copper wire is essentially coplanar with a top surface of the first dielectric layer, wherein each copper wire comprises copper;

after said forming the at least one copper wire, forming a recess in the first dielectric layer from the top surface of each copper wire to a recess depth within the first dielectric layer such that the recess surrounds and is in direct mechanical contact with a perimeter surface of each copper wire, wherein the recess depth is less than a thickness of each copper wire in a direction perpendicular to the top surface of each copper wire, and wherein each copper wire is within the first dielectric layer and extends above the first dielectric layer by the recess depth;

after said forming the recess, forming a capping layer in the recess and on the top surface of each copper wire and on the top surface of the first dielectric layer;

forming a second dielectric layer comprising one or more dielectric sublayers on and in direct mechanical contact with the capping layer, wherein each dielectric sublayer comprises a dielectric material that is specific to each dielectric sublayer, wherein the capping layer comprises a dielectric capping material configured to prevent copper of each copper wire from passing through the capping layer into the second dielectric layer;

wherein the recess depth has a magnitude sufficient to prevent a lateral fail of the capping layer during packaging and/or operation of the substrate;

wherein the lateral fail comprises a delamination of a portion of the capping layer from the first dielectric layer;

wherein the delamination is characterized by an angular gap comprising an acute angle exceeding zero degrees between the capping layer and the top surface of the first dielectric layer;

wherein the at least one copper wire further comprises a first copper wire consisting of a laser fuse conductor; and wherein the method further comprises: fuse blowing the first copper wire to vaporize a portion of the first copper wire and a portion of the capping layer to create a vaporization region in which the portion of the first copper wire has been vaporized and in which an electrical open in the first copper wire has been generated, wherein said lateral fail of the capping layer does not result from said fuse blowing of the first copper wire.

18. The method of claim 17, wherein the at least one copper wire further comprises a second copper wire consisting of a contact conductor and a third copper wire consisting of a wiring level conductor, and wherein the method further comprises:

forming an electrically conductive contact on and in direct mechanical and electrical contact with the second copper wire and through the capping layer, wherein the contact is on and in direct mechanical contact with a top surface of the second dielectric layer and extends above the top surface of the second dielectric layer, and wherein the contact is configured to be electrically connected to another substrate via an electrically conductive interconnect; and electrically coupling the third copper wire to at least one electrical device within a device layer of the substrate by an electrically conductive wiring path within the substrate.

* * * * *